United States Patent
Toh et al.

[19]

[11] Patent Number: 6,091,140
[45] Date of Patent: Jul. 18, 2000

[54] THIN CHIP-SIZE INTEGRATED CIRCUIT PACKAGE

[75] Inventors: Tuck Fook Toh; Chew Weng Leong; Chee Kiang Yew; Pang Hup Ong, all of Singapore, Singapore

[73] Assignee: Texas Instruments Incorporated, Dallas, Tex.

[21] Appl. No.: 09/178,129

[22] Filed: Oct. 23, 1998

[51] Int. Cl.$^7$ .................................................. H01L 23/52
[52] U.S. Cl. .......................... 257/691; 257/730; 257/784; 257/786
[58] Field of Search .................................. 257/668, 691, 257/698, 730, 780, 784, 786

[56] References Cited

U.S. PATENT DOCUMENTS

| | | | |
|---|---|---|---|
| 5,866,949 | 2/1999 | Schueller | 257/778 |
| 6,013,946 | 1/2000 | Lee et al. | 257/684 |

OTHER PUBLICATIONS

R.D. Schueller, et al., "New Chip Scale Package with CTE Matching to the Board," IEEE/CPMT Electronic Packaging Technology Conference, Oct. 1997, pp. 219–227.

*Primary Examiner*—John Guay
*Attorney, Agent, or Firm*—Wade James Brady, III; Frederick J. Telecky, Jr.

[57] ABSTRACT

In accordance with the present invention, there is provided an electrically insulating substrate having first and second surfaces, an outline and an opening. A plurality of electrically conductive routing strips is integral with the substrate. A plurality of contact pads is disposed on the first surface, at least one of the pads being electrically connected with at least one of the routing strips. A semiconductor chip is adhered to the second surface of the substrate. The chip has an outline that is substantially the same as the outline of the substrate. The chip has at least one bonding pad. Wire bonding electrically connects the bonding pad to a routing strip.

At least one bus bar is integral with the substrate. The bus bar is positioned remote from the substrate opening and is electrically connected to a bonding pad of the chip and to a contact pad disposed on the first surface of the substrate. At least one grounding pad is disposed on the first surface of the substrate, the grounding pad being electrically connected to at least one bus bar. Encapsulating material fills the opening and covers the wire bonding and the bonding pads. Solder balls are disposed on the contact pads positioned on the first surface of the substrate to enable attachment to wiring boards or other devices or applications. The overall profile of the integrated circuit package of the present invention is preferably about 0.78 mm.

13 Claims, 2 Drawing Sheets

THIN CHIP-SIZE INTEGRATED CIRCUIT PACKAGE

The present invention relates in general to the field of integrated circuit packages and more specifically to substantially flat integrated circuit packages having substantially the same outline as the circuit chip.

BACKGROUND OF THE INVENTION

Three of the major trends in semiconductor packaging are efforts to shrink the package outline so that the package consumes less area and less height when it is mounted onto the circuit board, and to reach these goals with minimum cost (both material and manufacturing cost). One of the most successful approaches has been the development of so-called "chip-scale packages". These packages have an outline adding less than 20% to the chip area; however, their height has not yet reached the desired low profile, and their cost is too high relative to the chip cost. In addition, some of the designs and processes being investigated have a detrimental effect on the overall device reliability. A chip-scale package which has only the size of the chip itself, is often referred to as "chip-size package".

Within the semiconductor memory product families, one of the most promising concepts for chip-scale packages is the so-called "board-on-chip" design. Recently, patent application serial # 9702348-5 entitled "Board on Chip—Ball Grid Array Chip Size Package" has been filed by Texas Instruments in Singapore on Jul. 2, 1997. This patent application for memory products successfully approaches the problems of reducing the area requirement by replacing the traditional leaded package design with a solder ball concept, and of reducing the height requirement by replacing the leadframe-on-chip assembly with a board-on-chip design. However, some frustrating problems remain unresolved: Gold wires in bonding assembly have to span high loops over metal lines on the board—since they must avoid accidental touching which would cause electrical shorts—which, in turn, limits the chance of reducing the package height. Or otherwise cumbersome and expensice insulation has to be applied over the metal lines to prevent electrical shorts to the gold wires.

Furthermore, if the process of wire bonding is to be executed using installed conventional bonder equipment, electrical grounding of the device is required in order to close an electrical control circuit involving the bonder as well as the bond-to-be made and to insure defect-free bonding quality. As long as metallic leadframes are being used, this requirement is no issue, but it becomes a problem when boards, films or flexible printed circuits made of insulating material are used. Proposed solutions employing needle-like movable probes are cumbersome for mass production. A more elegant and low cost design solution is desirable.

Consequently, a need has arisen for package designs and methods of device fabrication that provide simplified, low-cost processes resulting in simplified and more reliable products, and at the same time achieve improvements towards the goal of small outline and low profile packages. Preferably, these improvements should be accomplished using the installed equipment base so that no investment in new manufacturing machines is needed.

SUMMARY OF THE INVENTION

The present invention comprises an integrated circuit package and a method for fabricating an integrated circuit package that provides a small outline and a low profile. The integrated circuit package of the present invention also simplifies the design and the manufacturing of components which form part of the package.

It is an object of the present invention to provide a low-cost method and system for packaging chip-size devices in thin overall profile.

Another object of the present invention is to provide reliability assurance for the finished product through in-process control at no extra cost.

Another object of the present invention is to introduce package design concepts for thin profiles and reliability which can be applied for several future generations of products.

Another object of the present invention is to minimize the cost of capital investment and the movement of parts and product in the equipment.

These objects have been achieved by the device of the invention and a mass production process.

Various modifications have been employed for the assembly of silicon chips as well as connective substrates.

In accordance with the present invention, there is provided an electrically insulating substrate having first and second surfaces, an outline and an opening. A plurality of electrically conductive routing strips is integral with the substrate. A plurality of contact pads is disposed on the first surface, at least one of the pads being electrically connected with at least one of the routing strips. A semiconductor chip is adhered to the second surface of the substrate. The chip has an outline that is substantially the same as the outline of the substrate. The chip has at least one bonding pad. Wire bonding electrically connects the bonding pad to a routing strip.

At least one bus bar is integral with the substrate. The bus bar is positioned remote from the substrate opening and is electrically connected to a bonding pad of the chip and to a contact pad disposed on the first surface of the substrate. At least one grounding pad is disposed on the first surface of the substrate, the grounding pad being electrically connected to at least one bus bar. Encapsulating material fills the opening and covers the wire bonding and the bonding pads. Solder balls are disposed on the contact pads positioned on the first surface of the substrate to enable attachment to wiring boards or other devices.

The solder balls preferably have a diameter between 0.1 and 0.5 mm. The chip has preferably a thickness between 0.2 and 0.5 mm. The substrate preferably has a thickness between 0.2 and 0.7 mm. The encapsulating material has a thickness between 0.05 and 0.15 mm over the bonding wires. The overall profile of the integrated circuit package is preferably between 0.5 and 1.7 mm. More specifically, the overall profile of the integrated circuit package of the present invention is preferably about 0.78 mm.

In accordance with the present invention there is provided a method for connecting a bond-open/short-sensor system between the bonding wire and a source of reference voltage. An electrical conductor coupled to the source of reference voltage is connected to the grounding pad and a function of the impedance between the bond-open/short-sensor system and the electrical conductor is measured. The measurement assures the reliability of the freshly formed wire bond. After the measurements during the formation of each bond, the grounding pad is no longer needed and can be separated from the remainder of the substrate for completing the chip-size package.

The technical advance represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a simplified and schematic cross sectional view of an integrated circuit package as used by known techology.

FIG. 2 is a simplified and schematic view of an integrated circuit package with design features as used by known technology.

DETAILED DESCRIPTION OF THE PREFERRED EMBODIMENTS

The present invention is related to high frequency integrated circuits having both a low profile and a small outline package, and are assembled using existing manufacturing equipment. As defmed herein, the term "outline" relates to the overall width and length of the intergrated circuit package of the present invention. The outline of the package is also referred to as the footprint of the package, because it defmes the surface area on a wiring or assembly board that the package will occupy. The term "substantially the same" refers to the difference in size of the outlines of the silicon chip and the package substrate. As has been demonstrated by Texas Instruments, that difference may be about 2%, or may vanish altogether. It is should be stressed that the term "substantially the same" does not indicate which of the two components is larger, as either form is emcompassed by the present invention. As defmed herein, the term "profile" refers to the thickness or height of the integrated circuit package. This definition does include the height of the solder balls before they are reflown in board attachment.

The present invention meets the requirement for space constraint of continually shrinking applications such as cellular communications, pagers, hard disk drives, laptop computers and medical instrumentation. The present invention also helps to maximize high speed performance and addresses the problems associated with the electronic capacity of the chip assembly. The principles of the present invention may be incorporated into dynamic random-access memory (DRAM), synchronous DRAM (SDRAM), static random-access memories (SRAM), erasable programmable read-only memories (EPROM), logic circuits (LOGIC) and many other integrated circuit components.

Figure 1:
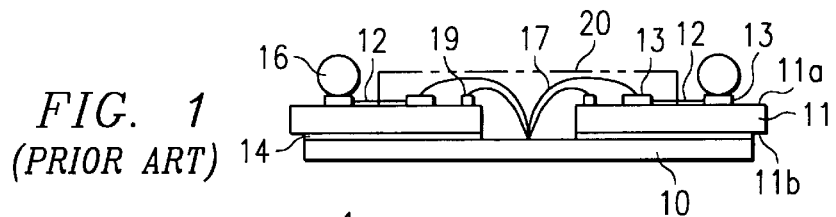
FIGS. 1 and 2 refer to prior art.

The impact of the present invention can be most easily appreciated by highlighting the shortcomings of the known technology. FIG. 1 shows the simplified and schematic cross section of a board-on-chip package of the prior art, comprising a silicon chip 10, which can be, for example, an integrated circuit component such as a DRAM chip. An electrically insulating board 11 has a first surface 11a and a second surface 11b. Furthermore, it has a plurality of conductive routing strips 12 and contact pads 13 deposited on its first surface 11a, and has the silicon chip 10 attached to its second surface 11b such that this second surface 11b faces the circuit surface of chip 10. In spite of the fact that board 11 is positioned on top of the circuit surface of chip 10, it is referred to as the "substrate" of the package. The attachment between board 11 and chip 10 is enabled by an adhesive layer 14.

Substrate 11 is made of electrically insulating material such as the epoxy resin FR-4. It has typically a thickness of 0.3 mm. Alternatively, a polyimide-based substrate may be used. The adhesive layer 14 may be made of, for example, a double-sided adhesive polyimide tape.

Figure 2:
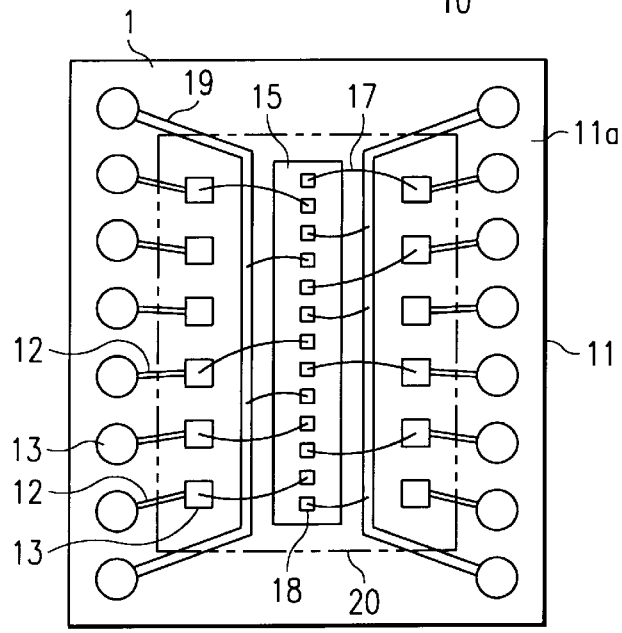

As shown in FIG. 2, substrate 11 has an opening 15 and, on its surface 1 1a, a plurality of electrically conductive routing strips 12 and contact pads 13. These routing strips 12 are integral with substrate 11 and constitute a network of connections for electrical ground, power and signal lines. One group of contact pads 13 is positioned close to and along the peripheral edges of substrate 11. Disposed on these contact pads are solder balls 16 which are needed for the final package attachment to the customer application boards. Another group of contact pads is positioned in a row approximately parallel to the edges of opening 15 so that they can receive the stitch ends of the whisker wires 17. These wires connect to the chip bonding pads 18, arranged generally in the central area of chip 10.

As can be seen in FIGS. 1 and 2, a pair of bus bars 19 is positioned parallel and close to edges of opening 15. The bus bars electrically connected to one or more of the pads 13. The bus bars may serve, for example, as power supplies or grounds. A number of chip bonding pads 18 are connected to the bus bars 19 by wire bonding 17.

The whisker wires 17 (usually gold) are bonded after the silicon chip 10 has been adhered to the substrate 11. Known technology allows a pitch of gold balls between 70 and 100 μm. Moving the bonder capillary containing the gold wire in a predetermind and computer-controlled manner through the air will create a wire looping of exactly defmed shape; for instance, recent technical advances allow the formation of sequential paths of different looping heights. With this capability, wire loops high enough for safely crossing the bus bars can be manufactured.

After all the bonding pads 18 that require electrical connection to the substrate 11 are connected, the opening 15 is filled with potting or molding material (dashed line 20 in FIGS. 1 and 2) up to a height of about 20 to 50 μm on top of the maximum loop height. Consequently, the potting material will rise significantly (sum of loop height and potting height) over the surface 11a of the substrate.

The diameter, or thickness, of the solder balls 16 must exceed the thickness of the potting material 20 extending over surface 11a. Since the high wire looping necessitates significant potting material thickness, the solder balls must have the relatively large diameter of typically between 0.25 and 0.4 mm.

Referring collectively to FIGS. 1 and 2, the problem encountered by the depicted geometries is the fact that all wires 17 from the chip bonding pads 18 to the substrate contact pads 13 have to cross one of the bus bars 19. Under no circumstance can it be tolerated that one of those wires would get in electrical contact with a bus bar since this electrical short would cause malfunction of the intergrated circuit. This problem has persisted for more than a decade, ever since center line bonding was introduced in the 1 Mbit DRAM product familiy. Three solutions are being exploited in known technology, all of them cumbersome, expensive and with severe technical repercussions:

High looping spans of the wires from the chip bonding pads to the substrate contact pads are employed to cross the bus bars. This negates the desire to reduce the height of the encapsulating material and thus the overall thickness of the package, and leaves the package too thick for emerging thin product applications.

A different plane (usually physically elevated) for the contact pads is introduced separate from the plane of the bus bars. In this manner, the wires are looping in a natural arc over the bus bars. However, this requires substrates composed of multiple layers, with multilayer metallization for the routing strips. This, in turn, limits the reduction of package thickness, and is expensive.

An electrically insulating coating is applied to the bus bars in all places where wires will cross the bus bars. Among the techniques tried in the past were polyimide layers, flame-deposited oxides, or insulating tape. All of these approaches are technically difficult and economically not acceptable.

The present invention avoids these difficulties by the following design and process innovations. In addition, the present invention also applies to designs other than centerline bonding, and it includes provisions to perform certain assembly operations under specified electrical bias needed for easiest performance. Although the board-on-chip layout of the intergrated circuit package will be described in FIGS. 3 and 4 using centralized bonding pads of the circuit chip, it should be understood by one skilled in the art that the principles of the present invention are applicable to a circuit chip with bonding pads in alternate layouts such as positioned along the sides of the circuit chip. Furthermore, the circuit chip may be made of silicon, gallium arsenide, or any other semiconductor material customarily used in electronic device production.

Figure 3:
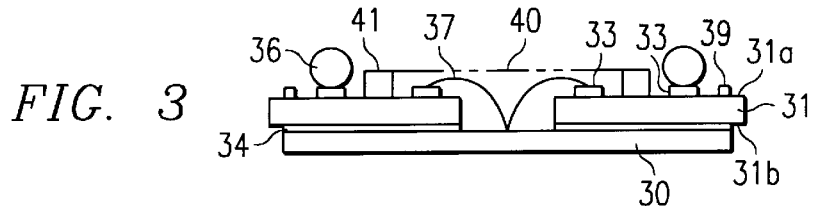
FIG. 3 is a simplified and schematic cross sectional view of an integrated circuit package of the present invention.
Figure 4:
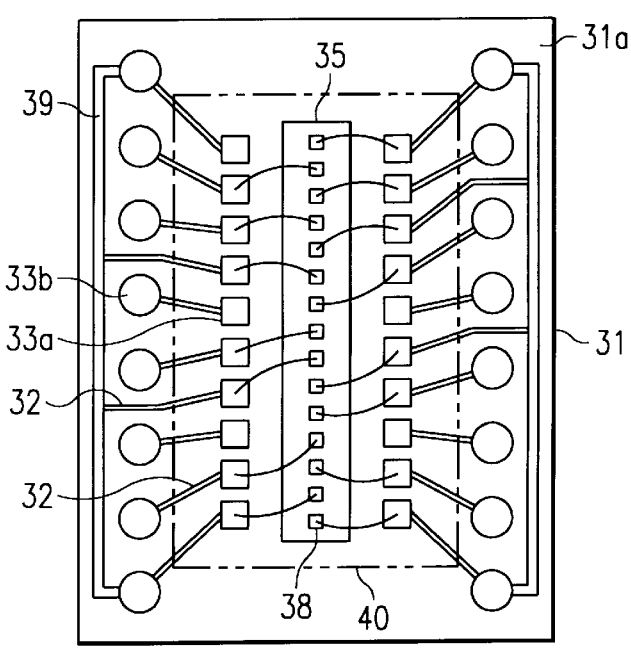
FIG. 4 is a simplified and schematic top view of an integrated circuit package with design features of the present invention.

FIG. 3 is a simplified and schematic cross sectional view, and FIG. 4 is a simplified and schematic top view, of an integrated circuit package of the present invention. The silicon chip 30 can be, for example, an integrated circuit component such as a DRAM, a SDRAM, an EPROM, a LOGIC, a microprocessor or a digital signal processor chip. Its thickness is typically between 0.2 to 0.5 mm, preferably 0.28 mm. An electrically insulating board 31 with a first surface 31a and a second surface 31b has its second surface 31b attached to the silicon chip 10 by means of an adhesive layer 34. This attachment is such that second surface 31b of the board faces the circuit surface of chip 30. Consequently, the "back" surface of chip 30 is facing the environment and is thus available for dissipating thermal energy and cooling of the heat generated by the chip in operation. In spite of the fact that board 31 is positioned on top of the circuit surface of chip 30, it is referred to as the "substrate" of the package. The substrate 31 has a plurality of electrically conductive routing strips 32 and a plurality of contact pads 33 deposited on its first surface 31a. Routing strips 32 and contact pads 33 comprise copper layers, or copper with gold-flash surface, or refractory metal layers followed by copper layers with gold flash. Alternatively, the may comprise copper layers followed by nickel layers.

Substrate 31 is made of electrically insulating material such as FR-4, which is an epoxy resin, or a cyanate ester resin, reinforced with a woven glass cloth. Alternatively, a polyimide-based substrate may be used. Substrate 31 has a thickness of between 0.1 and 0.7 mm; a preferred thickness is 0.2 mm. The adhesive layer 34 may be made of, for example, a double-sided adhesive polyimide tape, adhesive glue, epoxy, or thermoplastic adhesive.

As shown in FIG. 4, substrate 31 has an opening 35 and, on its surface 31 a, a plurality of electrically conductive routing strips 32 and contact pads 33a and 33b . These routing strips 32 are integral with substrate 31 and constitute a network of connections for electrical ground, power and signal lines. One group of contact pads 33a is positioned immediately close to and approximately parallel to the edges of opening 35. These contact pads 33a receive the stitch ends of whisker wires 37 not only for signal line connections, but also for power and ground connections. The surface of contact pads 33a are compatible with easy stitch bonding and comprise a gold flash surface. Wires 37 connect to the chip bonding pads 38, arranged generally in the central area of chip 30 in FIGS. 3 and 4. Since these contact pads 33a are aligned in a row, FIG. 3 shows only one representative on each side of opening 35. The latter contact pads are connected through routing strips 32 to the second group of contact pads 33b which is in some proximity to and along the peripheral edges of substrate 31. Disposed on contact pads 33b are solder balls 36 which are needed for the final package attachment to the customer application boards. The surface of contact pads 33b is compatible with easy attachment of solder balls; it may comprise gold, palladium, or platinum. It should be mentioned that the term solder "balls" used herein does not imply that the solder contacts are necessarily spherical; they may have various forms, such as semispherical, half-dome, truncated cone, or generally bump. The exact shape is a function of the deposition technique (such as evaporation, plating, or prefabricated units) and reflow technique (such as infrared or radiant heat), and the material composition. Several methods are available to achieve consistency of geometrical shape by controlling amount of material and uniformity of reflow temperature.

As can be seen in FIGS. 3 and 4, a pair of bus bars 39 is positioned parallel to and in immediate proximity to the edges of chip 31. This arrangement is important for the present invention. It is based on the possibility to connect them electrically to contact pads 33a by means of conductive routing strips without electrically affecting the function of bus bars 39 as power supply or ground potential. The bus bars may serve, for example as power supplies or grounds, and it is preferred that one bus bar 39 serve one function, such as a power supply, and the second bus bar 39 serve another function, such as ground. A number of chip bonding pads 38 are connected by wire bonding 37 to the contact pads 33a leading to the bus bars 39.

Since the bus bars are positioned far away from any wire crossing, any electrical insulation against wire shorting is no longer an issue.

The wire bonding process begins after the circuit chip 30 has been adhered to the substrate 31. Together they are positioned on a heated pedestal to raise their temperature to beetween 170 and 300° C. A wire typically of gold, gold-berryllium alloy, other gold alloy, or copper, having a diameter typically ranging from 18 to 32 $\mu$m is strung through a heated capillary where the temperature usually ranges between 200 and 500 ° C. At the tip of the wire, a liquid ball is created using either a flame or a spark technique. The capillary is moved towards the chip bonding pad 38 and the ball is pressed against the metallization of the bonding pad (typically aluminum, aluminum-copper alloy, or copper). A combination of compression force and ultrasonic energy create the formation of gold-aluminum intermetallics and thus the strong metallurgical bond. In the case of copper wire on copper pad, only metal interdiffusion takes places in order to generate the strong weld.

It is important for the present invention that recent technical advances in wire bonding now allow the formation of small yet reliable ball contacts; ball pitches as small as between 75 and 50 $\mu$m can be achieved. Moving the capillary in a predetermind and computer-controlled manner through the air will create a wire looping of exactly defmed shape; for instance, recent technical advances allow the formation of rounded, trapezoidal, linear ot looped paths. Finally, the capillary reaches its desired destination, for instance contact pad 33*a*. The capillary is lowered to touch the pad; with an imprint of the capillary, a metallurgical stitch bond is formed, and the wire is flamed off to release the capillary.

It is important for the present invention that recent technical advances allow the formation of small yet reliable stitch contacts; the lateral dimension of the stitch imprint is about three times the wire diameter (its exact shape depends on the shape of the capillary used, such as capillary wall thickness and capillary footprint). Consequently, the area of the contact pads 33*a* can be designed so small that a large number of contact pads can be lined up side by side along the side edge of opening 35 so that even a large total number of chip contact pads (power plus ground plus signal contacts) can be wire bonded to substrate 31.

It is further important for the present invention that recent technical advances allow the formation of the wire looping with a minimum length of bonding wire by moving the bonding capillary the shortest feasible distance over the surface of the substrate 31. As a consequence, the looping of wires 37 can cross the substrate 31 at a height of approximately 10 $\mu$m and approach the pad surface at a low angle (at the stitch, there is no minimum height for a ball needed, nor is there a heat-affected wire zone which would be mechanically weak for bending or other deformation stresses). Because of this minimum wire looping, high looping spans are no longer an issue.

Nor is there any need to position the signal contact pads onto a physically elevated level in order to facilitate the crossing by the wires of the intervening bus bars.

After all the bonding pads 38 that require electrical connection to the substrate 31 are connected, the opening 35 is filled with potting or molding material (dashed line 40 in FIGS. 3 and 4) up to a height of about 20 to 50 $\mu$m on top of surface 31 a of substrate 31. The potting material will be contained by polymer stopping walls 41 which are 20 to 50 $\mu$m high and have been pre-attached to substrate 31. The potting material may be a cyanate ester-type resin, available for instance from Shin-Etsu Chemical Co., Ltd. (under the names KMC 184VA or KMC 188VA-4). Other material choices include epoxies, polyesters, polyimides, cyanocrylates, ceramic, silicone, urethane, and conventional molding materials. Like molding materials, these potting materials may contain fillers that affect the coefficient of thermal expansion, as well as the strength and flexibility of the potting material.

The diameter, or thickness of the solder balls 36 must exceed the thickness of the potting material 40 extending over surface 31*a*. Since the minimum wire looping permits thin potting material thickness (20 to 50 $\mu$m), the solder balls need only the relatively small diameter of typically 0.1 to 0.3 mm; preferred solder ball diameter is 0.2 mm.

Summarizing the embodiment of FIGS. 3 and 4: With the height savings deriving from substrate 31, potting material 40, and solder balls 36, as enabled by the design layout of bus bars 39 and subsequent reduction in looping height of bonding wires 37, the thickness (or "profile") of the overall chip-size integrated circuit package of the invention is 0.5 to 1.7 mm; the preferred profile is about 0.75 to 0.78 mm. This profile is significantly reduced compared to conventional profiles of 1.0 mm for packages with exposed backside of the chip (and 1.2 mm when the chip is encapsulated with a thin plastic coating). Because of its reduced profile, the chi-size integrated circuit package of the invention may be called "thin". In FIGS. 3 and 4, the back side of the circuit chip 30 is exposed (not covered with an encapsulating material) which improves thermal dissipation.

The thin package of the present invention is more reliable than conventional thicker packages, because it reduces mechanical stress. While the difference in coefficients of thermal expansion between plastic substrate 31 and semiconductor (for instance, silicon) chip 30 still remains, the diminished thickness of substrate 31 reduces significantly the force it is able to exert onto chip 30 and solder balls 36.

As can be seen in FIGS. 3 and 4, substrate 31 is designed to have substantially the same outline as the circuit chip 30. The length of the package, as for example for DRAMs, may be between about 12.5 and 20 mm, with a length of about 15 mm being preferred. The width of the package, as for example for DRAMs, may be beween about 5 and 12.5 mm, with a width of about 6.5 mm being preferred. The similarity in length and width between substrate 31 and circuit chip 30 is possible due to the internal positioning of the electrical connections between the circuit chip 30 and the substrate 31 by looping the wire bonding 37 through the opening 35.

Figure 5:
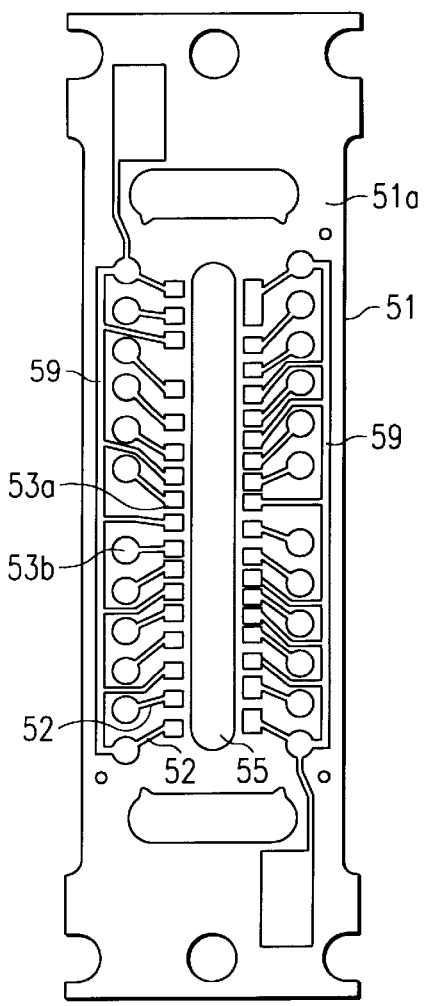
FIG. 5 is a top view of a first embodiment of the package substrate of the present invention.

FIG. 5 illustrates an embodiment of the present invention for a silicon 16 Mbit DRAM package. The electrically insulating substrate 51 has a first surface 51*a* and an opening 55. A plurality of electrically conductive routing strips 52 are integral with substrate 51. Contact pads 53*a* are disposed on surface 51*a* and are aligned parallel and in close proximity to the edge of opening 55. Contact pads 53*a* are connected with routing strips 52. Contacts pads 53*b*, also connected with routing strips 52, have an arrangement and geometry to receive solder balls. A semiconductor circuit chip can be adhered to the substrate surface opposite to suface 31*a* and wire bonded to contact pads 32*a*. This semiconductor circuit chip preferably has the same outline as substrate 51. FIG. 5 shows a pair of bus bars 59 which are integral with substrate 51 and electrically connected by routing strips 52 to contact pads 53*a*. Importantly, the bus bars 59 are positioned remote from opening 55; as a matter of fast, they run parallel to and in close proximity to the peripseral edges of stubstrate 51.

Figure 6:
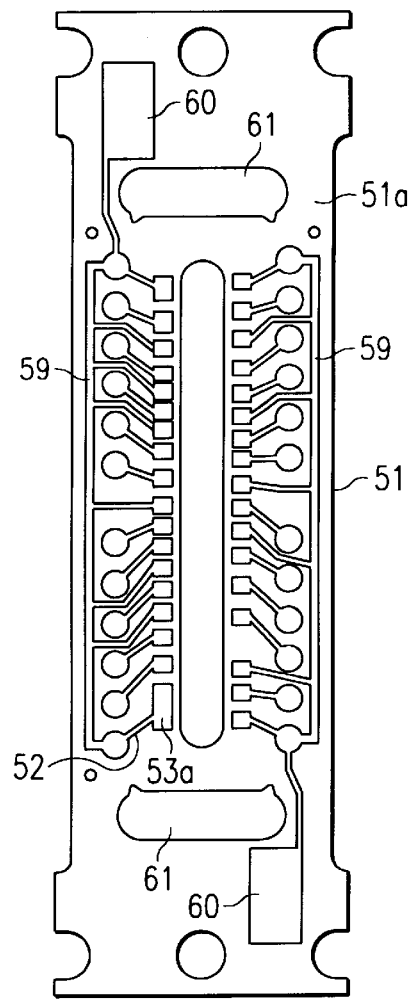
FIG. 6 is a top view of a second embodiment of the package substrate of the present invention.

Another embodiment of the present invention is shown in FIG. 6. Disposed on, and integral with, surface 51*a* of substrate 51 is a pair of grounding pads 60. Each grounding pad 60 is designed so that it is electrically connected to one of the bus bars 59; this connection is independent of the particular location of bus bar 59. During the wire bonding process, electrical gound potenial can be applied to grounding pads 60 and from there to the bus bars 59, routing strips 52 and contact pads 53*a*. This ground potential serves, as described in more detail below, the application of a bond open/short sensor system for testing the testing the ball bond and the stitch bond while the bonding process is in operation. Defects are thus detected right away and can easily be corrected. This capability of real time process control is highly desirable in semiconductor manufacturing as it permits the in-process control needed for built-in quality and reliability. As is known to persons skilled in the art, it is far easier and more cost efficient to build-in reliability than to test-in reliablity.

After the bonding operation has been completed, grounding pads 60 are no longer needed. They can safely be separated from the main package of the device, after the assembly and packaging processes have been completed. FIG. 6 shows openings 61, which serve the purpose of simplifying the separation of the grounding pads 60 from the main package of the device.

Figure 7:
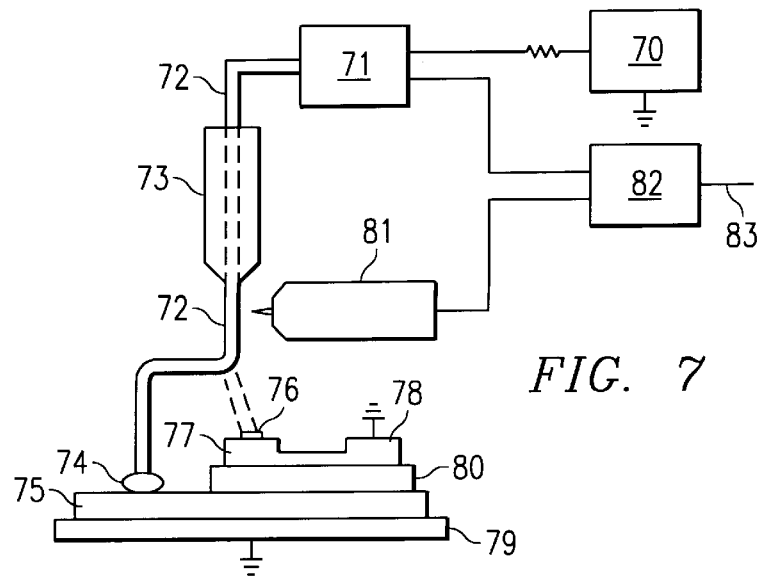
FIG. 7 is a schematic diagram of a Bond Open/Short Sensor system used for wire bonding in conjunction with the package features of the present invention.

FIG. 7 illustrates the "Bond Open/Short Sensor" (BOSS) system needed for process control in the wire bonding operation. The BOSS electronics is contained in equipment 70. It is essential that equipment 70 is connected to ground potential. BOSS system 70 is electrically connected to the bond wire spool housed in container 71. The wire typically used is made of gold or a gold alloy; alternatively, it consists of copper. Bonding wire 72 emerges from the spool housing 71 and is fed through capillary 73. From wire 72, gold ball 74 has been formed on the bonding pad of semiconductor chip 75, before capillary 73 is moved through the air to form stitch 76 from wire 72. Stitch 76 is formed on contact pad 77, integral with electrically insulating substrate 80 attached to semiconductor chip 75. Semiconductor chip 75 is positioned on heater block 77, which, in turn, is electrically connected to ground potential. This closes the electrical circuit to the BOSS system and allows the application of process control during the ball bonding operation. Contact pad 77 is electrically connected to grounding pad 78, which, in turn, is electrically connected to ground potenial. This closes the electrical circuit to the BOSS system and allow the application of process control during the stitch bonding operation.

The formation of the gold ball is enabled by the electrode 81 of the of the electronic flame-off system (EFO). The EFO is housed in equipment 82, which is connected by wiring 83 to a digital connection and control system. Electrode 81 is also needed for flaming off the gold wire after completing stitch bond 76.

The electrical connections shown in FIG. 7 and enabled by the present invention, allow several process control functions involving the BOSS system: BOSS Test 1 is a feedback signal after firing of the EFO. BOSS Test 2 detects gold ball bond integrity. BOSS Test 3 detects stitch bond integrity. BOSS Test 4 detects wire break ("pig tail break") after flame-off, and thus again stitch bond integrity. BOSS Test 5 tests gold ball bond 74 continuity on bonding pad.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A semiconductor device comprising:

an electrically insulating substrate having first and second surfaces, an outline and an opening;

a plurality of electrically conductive routing strips integral with said substrate;

a plurality of contact pads disposed on said first surface, at least one of said contact pads electrically connected with at least one of said routing strips;

a semiconductor circuit chip adhered to said second surface of said substrate, said chip having an outline that is substantially the same as said outline of said substrate, said chip having at least one bonding pad;

bonding wires electrically connecting said at least one bonding pad to at least one of said routing strips;

at least one bus bar integral with said substrate, said at least one bus bar electrically connected to at least one of said contact pads and to at least one of said bonding pads;

said at least one bus bar positioned remote from said opening;

encapsulating material filling said opening to cover said bonding wires and said at least one bonding pad; and at least one solder ball disposed on at least one of said contact pads;

wherein said at least one bus bar is positioned more remote from said at least one bonding pad than said contact pads.

2. The semiconductor device according to claim 1 wherein the over profile of said device is about 0.78 mm.

3. The semiconductor device according to claim 1 wherein said at least one bus bar is electrically connected to at least one conductive routing strip being integral with said substrate.

4. The semiconductor device according to claim 1 wherein said routing strips are spaced about said opening.

5. The semiconductor device according to claim 1 wherein said encapsulating material has a thickness of between about 0.05 and 0.15 mm over said bonding wires.

6. The semiconductor device according to claim 1 wherein said encapsulating material has a thickness of about 0.1 mm over said bonding wires.

7. The semiconductor device of claim 1 wherein said at least one solder ball is between about 0.1 and 0.5 mm in diameter.

8. The semiconductor device of claim 1 wherein said at least one solder ball is about 0.2 mm in diameter.

9. The semiconductor device according to claim 1 wherein said chip has a thickness of between about 0.2 and 0.5 mm.

10. The semiconductor device according to claim 1 wherein said chip has a thickness of about 0.28 mm.

11. The semiconductor device according to claim 1 wherein said substrate has a thickness of between about 0.1 and 0.7 mm.

12. The semiconductor device according to claim 1 wherein said substrate has a thickness of about 0.2 mm.

13. The semiconductor device according to claim 1 wherein the overall profile of said device is between about 0.5 and 1.7 mm.

* * * * *